(12) United States Patent
Schafstall et al.

(10) Patent No.: US 10,740,910 B1
(45) Date of Patent: Aug. 11, 2020

(54) VOLUME FRACTION APPARATUSES AND METHODS

(71) Applicant: MSC.Software Corporation, Newport Beach, CA (US)

(72) Inventors: Hendrik Schafstall, Hamburg (DE); Peter Kraft, Hamburg (DE); Ted B. Wertheimer, Los Altos, CA (US)

(73) Assignee: MSC.Software Corporation, Newport Beach, CA (US)

( * ) Notice: Subject to any disclaimer, the term of this patent is extended or adjusted under 35 U.S.C. 154(b) by 447 days.

(21) Appl. No.: 15/388,918

(22) Filed: Dec. 22, 2016

(51) Int. Cl.
*G06T 7/50* (2017.01)
*G06T 15/08* (2011.01)
*G06T 17/20* (2006.01)
*G06F 30/23* (2020.01)

(52) U.S. Cl.
CPC ............... *G06T 7/50* (2017.01); *G06F 30/23* (2020.01); *G06T 15/08* (2013.01); *G06T 17/20* (2013.01); *G06T 2200/04* (2013.01)

(58) Field of Classification Search
CPC ....... G06T 17/20; G06T 17/5018; G06T 7/50; G06T 2200/04; G06T 15/08; G06F 30/23
See application file for complete search history.

(56) References Cited

U.S. PATENT DOCUMENTS

| 6,671,656 | B2 * | 12/2003 | Shimamura | G06F 17/5018 345/424 |
| 6,897,864 | B2 * | 5/2005 | Sato | G06T 19/20 345/424 |
| 7,167,816 | B1 * | 1/2007 | Olovsson | G06F 17/5018 700/98 |
| 7,275,023 | B2 * | 9/2007 | Chen | G06F 17/5018 345/421 |
| 8,502,818 | B1 * | 8/2013 | Mueller-Fischer | G06T 17/20 345/420 |
| 8,970,590 | B1 * | 3/2015 | Brennan | G06T 17/10 345/423 |
| 2004/0090437 | A1 * | 5/2004 | Uesaki | G06T 17/30 345/420 |
| 2016/0203630 | A1 * | 7/2016 | Pai | G06T 13/40 345/473 |

* cited by examiner

*Primary Examiner* — Eunhee Kim
(74) *Attorney, Agent, or Firm* — Foley & Lardner LLP

(57) ABSTRACT

Examples described herein relate to apparatuses and methods for performing finite element analysis of a model of a physical object, the method comprising determining regular elements for the model, wherein each of at least some of the regular elements partially contains a portion of the model, and performing the finite element analysis based, at least in part, on the at least some of the regular elements, wherein the finite element analysis is a structural finite element analysis.

20 Claims, 8 Drawing Sheets

VOLUME FRACTION APPARATUSES AND METHODS

BACKGROUND

Conventional Finite Element Methods (FEMs) can be used to perform simulations to model structural, thermal, and electromagnetic behaviors of a physical object using regular elements. For instance, a voxel mesh is a mesh composed of regular elements that can be created for a structural model representing a physical object. An octree can be implemented to organize the regular elements of the voxel mesh. In the traditional voxel mesh, each regular element is fully contained in the structural object model. That is, a regular element in a conventional voxel mesh is 100% filled by a portion of a structural object. A regular element that does not entirely contain a portion of the structural object (e.g., a regular element that partially contains a portion of the structural object and is partially empty) is omitted or ignored for the simulations.

Thus, smaller regular elements are used to represent a physical object in order to increase simulation accuracy in faithfully capturing behaviors of the physical object. However, greater computer memory capacity is required to generate and simulate the smaller and more numerous regular elements, leading to greater computational costs.

SUMMARY OF THE INVENTION

Examples described herein related to methods and apparatuses for performing a Finite Element Analysis (FEA) or Finite Element Method (FEM) based on regular mesh elements that are (1) partially occupied with a corresponding portion of a model of a physical object, and (2) partially empty. A mesh can be defined independently of the geometry (e.g., surface geometry) of the model. A mesh (e.g., a voxel) mesh may include elements (e.g., regular elements) of a same size, shape, or volume. Instead of defining regular elements of smaller sizes to improve fidelity to the original shape of the model, examples set forth herein relate to using partially filled regular elements for simulating the behavior of the physical object. For instance, a volume fraction may indicate a percentage of a volume of a portion of the model enclosed by a particular regular element out of a total volume of the particular regular element. The total volume of each of the regular elements in a mesh may be the same. The volume fraction may range from 0% (e.g., the particular regular element does not include any portion of the model) to 100% (e.g., the particular regular element is fully occupied by a portion of the model). FEA or FEM may be performed with respect to the regular elements based on the volume fraction for each of the regular elements. Accordingly, processing power and time can be conserved by defining relatively larger regular elements for analysis and simulation. In addition, accuracy of the analysis and simulation can be improved by taking into consideration the volume fraction associated with each regular element.

In some examples, a method for performing finite element analysis of a model of a physical object includes determining regular elements for the model, wherein each of at least some of the regular elements partially contains a portion of the model, and performing the finite element analysis based, at least in part, on the at least some of the regular elements, wherein the finite element analysis is a structural finite element analysis.

In some examples, the model is a geometric representation of the physical object, the geometric representation is a closed-surface, and the closed-surface is a discretized surface or a continuous surface.

In some examples, the discretized surface is represented by triangular or quadrilateral patches, and the continuous surface is represented by at least one of a Bezier surface, Coons surface, or Non-Uniform Rational Basis Spline (NURBS) surface.

In some examples, the regular elements are voxel mesh elements having a uniform shape.

In some examples, the uniform shape is a rectangular cuboid.

In some examples, a combined volume of all the regular elements is greater than a volume of the model.

In some examples, each of at least one first regular element of the regular elements entirely contain a respective portion of the model.

In some examples, each of at least one second regular element of the regular elements excludes any portion of the model.

In some examples, performing the finite element analysis includes determining a volume fraction for each of one or more of the regular elements, storing the volume fraction for the one or more of the regular elements, and performing the finite element analysis based, at least in part, on the volume fraction for each of one or more of the regular elements.

In some examples, performing the finite element analysis comprises generating element matrices with respect to a volume or a surface area of the model.

In some examples, performing the finite element analysis further comprises evaluating the element matrices with respect to the one or more of the regular elements based on the volume fraction for the one or more of the regular elements.

In some examples, the method further includes displaying one or more of a geometric representation of the geometric representation or a mesh including the regular elements for the model.

According to various examples, a non-transitory computer-readable medium having computer-readable instructions such that, when executed by a processor, causes the processor to determine regular elements for the model, wherein each of at least some of the regular elements partially contains a portion of the model and perform the finite element analysis based, at least in part, on the at least some of the regular elements, wherein the finite element analysis is a structural finite element analysis.

In some examples, the processor performs the finite element analysis by determining a volume fraction for each of one or more of the regular elements, storing the volume fraction for the one or more of the regular elements, and performing the finite element analysis based, at least in part, on the volume fraction for each of one or more of the regular elements.

In some examples, the processor performs the finite element analysis by generating element matrices with respect to a volume or a surface area of the model.

In some examples, the processor performs the finite element analysis by further evaluating the element matrices with respect to the one or more of the regular elements based on the volume fraction for the one or more of the regular elements.

In some examples, the processor is further configured to cause a user interface to display one or more of a geometric representation of the geometric representation or a mesh including the regular elements for the model.

In various examples, an apparatus capable of performing finite element analysis of a model of a physical object includes a memory, a user interface, and a processor configured to determine regular elements for the model, wherein each of at least some of the regular elements partially contains a portion of the model, and perform the finite element analysis based, at least in part, on the at least some of the regular elements, wherein the finite element analysis is a structural finite element analysis.

BRIEF DESCRIPTION OF THE DRAWINGS

The disclosure will become more fully understood from the following detailed description, taken in conjunction with the accompanying figures, wherein like reference numerals refer to like elements, in which.

DETAILED DESCRIPTION

The detailed description set forth below in connection with the appended drawings is intended as a description of various aspects of the present disclosure and is not intended to represent the only aspects in which the present disclosure can be practiced. Each aspect described in this disclosure is provided merely as an example or illustration of the present disclosure, and should not necessarily be construed as preferred or advantageous over other aspects. The detailed description includes specific details for providing a thorough understanding of the present disclosure. However, it will be apparent to those skilled in the art that the present disclosure can be practiced without these specific details. In some instances, structures and devices are shown in block diagram form in order to avoid obscuring the concepts of the present disclosure. Acronyms and other descriptive terminology can be used merely for convenience and clarity and are not intended to limit the scope of the present disclosure.

While for purposes of simplicity of explanation, the methodologies are shown and described as a series of acts, it is to be understood and appreciated that the methodologies are not limited by the order of acts, as some acts can, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts can be required to implement a methodology in accordance with one or more aspects.

Referring generally to the FIGS., examples set forth in the present disclosure relate to apparatuses and methods for performing simulation of a model of a physical object using regular elements, some of which partially (and not entirely) contain a portion of the model. Instead of attaining improved modeling accuracy by defining smaller regular elements, examples described herein can be implemented in a computationally efficient and accurate manner for structural, thermal, and electromagnetic finite element analysis by employing the partially filled regular elements. Particularly, a numerical simulation using a Finite Element Analysis (FEA) or Finite Element Method (FEM) may be performed for the model for which one or more partially-filled regular elements have been defined.

Figure 1:
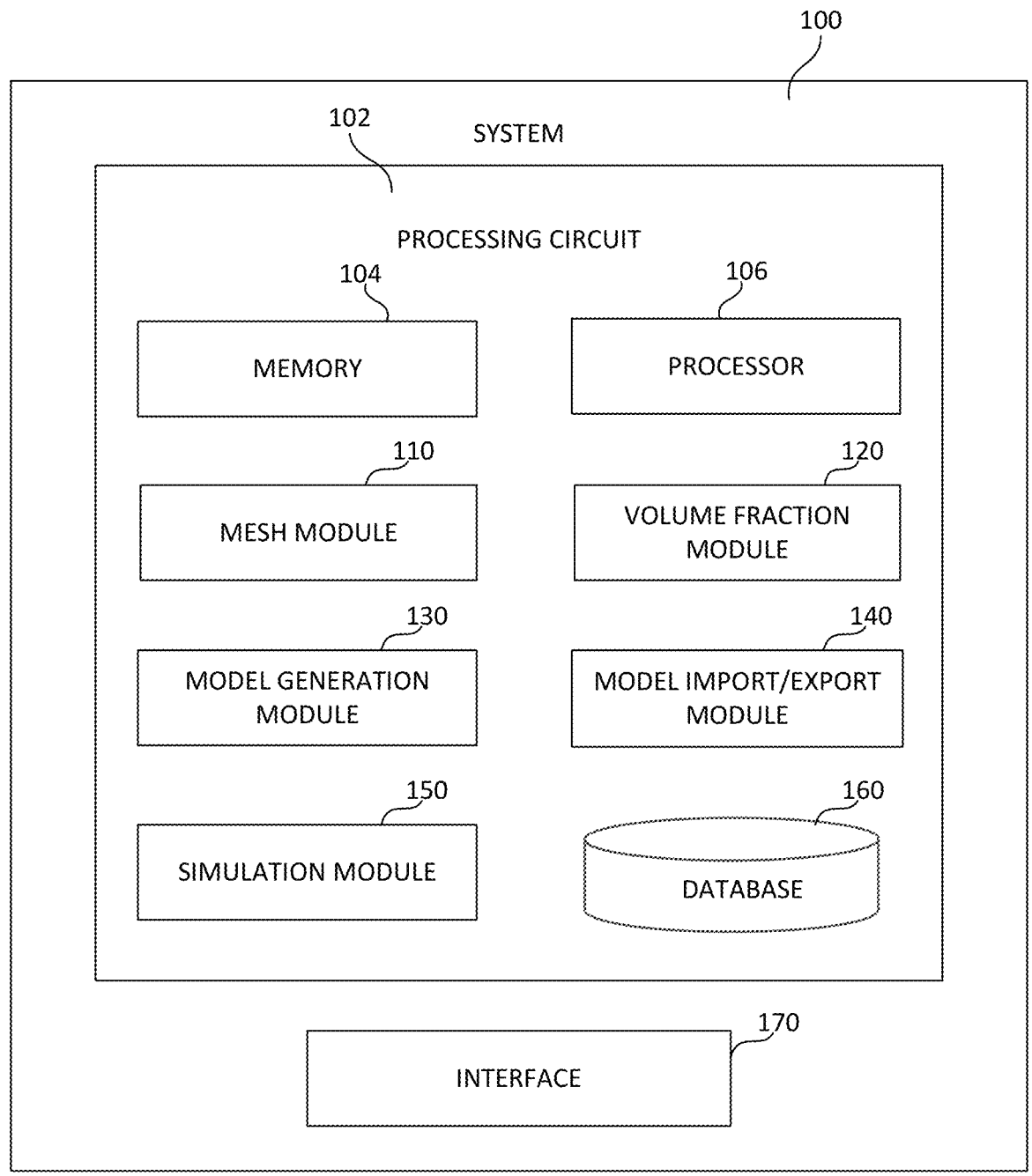
FIG. 1 is a block diagram illustrating an example of a system according to various examples.

FIG. 1 is a block diagram illustrating an example of a system 100 according to various examples. Referring to FIG. 1, the system 100 can include at least a mesh module 110, a volume fraction module 120, a model generation module 130, a model import/export module 140, and a simulation module 150 to implement features described herein. In particular, each of the mesh module 110, volume fraction module 120, model generation module 130, model import/export module 140, and simulation module 150 can be a module capable of virtually performing mesh elements definition, volume fraction determination, and simulation functionalities described herein. The system 100 can be executed on a FEA/FEM platform as well as other suitable simulation platforms.

In some examples, the system 100 may include a processing circuit 102 and an interface 170. The processing circuit 102 can be part of a workstation computer or other suitable types of computing device. The processing circuit 102 can include the various modules 110, 120, 130, 140, and 150 for executing various functions described herein. The processing circuit 102 may include a memory 104, processor 106, and database 160. The system 100 may include other suitable devices such as a network system, wireless or wired communications systems, printers, and/or the like for performing various functions described herein.

The processor 106 may include any suitable data processing device, such as a general-purpose processor (e.g., a microprocessor). But in the alternative, the processor 106 may be any conventional processor, controller, microcontroller, or state machine. The processor 106 may be implemented as a combination of computing devices, e.g., a combination of a Digital Signal Processor (DSP) and a microprocessor, a plurality of microprocessors, at least one microprocessors in conjunction with a DSP core, or any other such configuration. For example, the processor 106 may be, but is not limited to being, an Intel® designed processor, AMD® designed processor, Apple® designed processor, QUALCOMM® designed processor, or ARM® designed process. The processor 106 may be used to implement features of the various modules 110-150.

The memory 104 (or storage device) can be operatively coupled to the processor 106 and can include any suitable device for storing software instructions and data for controlling and use by the processor 106 to perform operations and functions described herein, including, but not limited to, Random Access Memory (RAM), Read Only Memory (ROM), floppy disks, hard disks, dongles or other Recomp Sensor Board (RSB) connected memory devices, or the like. The memory 104 can include non-transitory storage media that is configured to store information regarding a geometric model that is being currently modified or was created in the past and/or computer readable instructions for the processes performed by the processor 106 as described.

The memory 104 can send data to or receive data from the processor 106 and/or each of the modules/components 110-160 in the system 100. In some examples, the memory 104 can be a remote storage device that stores data for the system 100 (or only the processing circuit 102) in a different node of a network from the processing circuit 102 and/or the system 100. In other examples, the memory 104 can be located on the same computer system (e.g., within the same node of the network) as the processing circuit 102 and/or the system 100. In other examples, one or more of the various modules 110, 120, 130, 140, and 150 can be implemented with a dedicated memory unit (separate from the memory 104) such as, but not limited to, the memory 104.

The processor 106 can be coupled to one or more of all of the modules 110-150 in the system 100 for performing the functionalities of each of the coupled modules 110-150. For example, the processor 106 can implement the mesh module 110 for generating a mesh (e.g., a voxel mesh) having regular elements for a model. The processor 106 can perform such actions of the mesh module 110 automatically or based on (e.g., triggered by) user input. The user input can be received via an input device of the interface 170. The mesh module 110 (e.g., the processor 106) may be coupled to a display device of the interface 170 and may cause the display device to graphically display the mesh to a user.

The processor 106 can implement the volume fraction module 120. The volume fraction module 120 may determine a volume fraction for each regular element of the mesh defined by the mesh module 110. For instance, a volume fraction may indicate a percentage or a fraction of a volume of a portion of the model enclosed by a particular regular element out of a total volume of the particular regular element. The volume faction module 120 may classify each regular element of the mesh into one of three possible categories. The volume fraction module 120 (e.g., the processor 106) may be coupled to a display device of the interface 170 and may cause the display device to graphically display the volume fraction of one or more regular elements to a user and/or information related to the volume factions of the mesh.

In some examples, a regular element of a first class refers to any regular element that is fully enclosed by an exterior surface of the model. In other words, 100% of an interior volume of a regular element in the first class is occupied by a corresponding portion of the model. That is, a regular element in the first class has a volume fraction of 100%. A regular element of the second class refers to any regular element that excludes any portion of the model. In other words, 0% of an interior volume of a regular element in the second class is occupied by a corresponding portion of the model. That is, a regular element in the second class has a volume fraction of 0%. A regular element of the third class refers to any regular element that partially (but not completely) contains a respective portion of the model. In other words, between and excluding 0% and 100% of an interior volume of a regular element in the third class is occupied by a corresponding portion of the model. That is, a regular element in the third class has a volume fraction that is between and excluding 0% and 100%.

The processor 106 can implement the model generation module 130 for generating a model, for example, based on user input. In some examples, the model generation module 130 can be coupled to the user interface 170 for receiving user input (user-generated data) related to physical object or structure. The model generation module 130 can send model information of the generated model to one or more or all of the modules 110-150 in the system 100. The processor 106 can implement the model import/export module 140 to import and/or export models. In some examples, the model import/export module 140 can be configured to import model data from another memory device or another system. The model import/export module 140 can send model information corresponding to the imported model to one or more or all of the modules 110, 120, 130, 140, and 150 in the system 100. The model import/export module 140 can export the model to memory device or another system.

The processor 106 can implement the simulation module 150 to perform simulations (FEA or FEM) for the model (generated or imported) using at least one partially-filled regular element in the manner described. For instance, element matrices can be evaluated with respect to one or more of the regular elements of the defined mesh using numerical integration (e.g., Trapezoidal rule, Simpson's rule, Gaussian Integration, or the like).

In some examples, the database 160 can be any non-transitory storage medium capable of storing data. For example, the database 160 can store the volume fraction determined for each regular element of the mesh defined for the model.

The interface 170 can include at least one input device for receiving input from the user and at least one display device for relaying information to the user. For example, the input device can include a computer with a monitor, keyboard, keypad, mouse, joystick, touch screen display, or other input devices performing a similar function. The keyboard can include alphanumeric and other keys, and can be connected to processing circuit 102 (e.g., the processor 106 and the memory 104) for communicating information and command selections. The input device can include a touch screen interface or movement sensing interface that can be combined with, or separated from, the display device of the interface 170. The input device can include a cursor control device, such as, but not limited to, a mouse, trackball, touch screen, motion sensor, cursor direction keys, and the like. Such input device can control cursor movement on the display device. The display device of the interface 170 can be any type of display (e.g., Cathode Ray Tube (CRT) display, Liquid Crystal Display (LCD), etc.) configured to provide audio and/or visual output to the user.

As referred to herein, a "model" may refer to a geometric representation of a physical object, the behavior of which may be subject to modeling and simulation. The geometric representation may be a closed surface representing the physical object. The closed surface may be a discretized or continuous surface. For instance, the discretized surface may be represented by triangular patches, quadrilateral patches, or patches having another suitable shape. The continuous surface may be represented by Bezier surfaces, Coons surfaces, Non-Uniform Rational Basis Spline (NURBS) surfaces, or another suitable type of surfaces.

Figure 2:
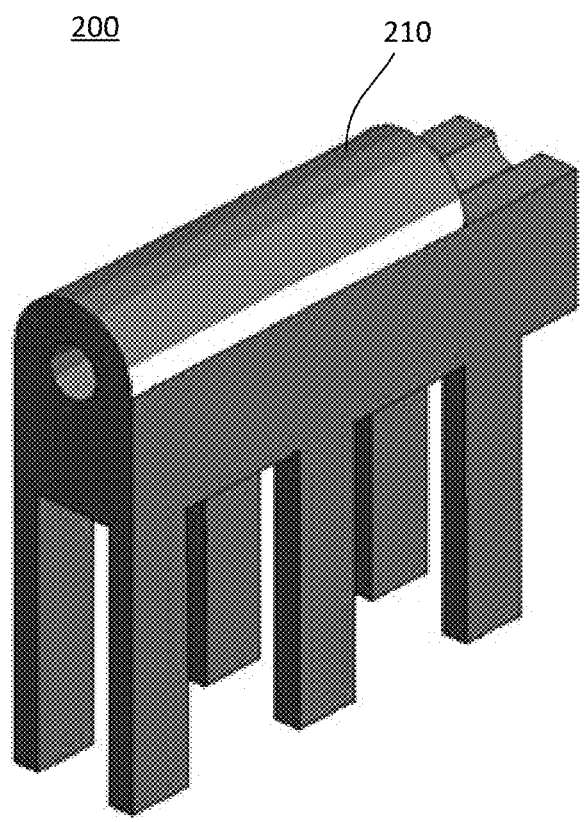
FIG. 2 is a diagram illustrating a perspective view of a model representing a physical object.

Illustrating with a non-limiting example, FIG. 2 is a diagram showing a perspective view of a model 200 representing a physical object. Referring to FIGS. 1-2, the model 200 may be represented geometrically by a continuous surface 210. In the non-limiting example of FIG. 2, the continuous surface 210 may be a NURBS surface. Generation of the model 200 may be facilitated by the model generation model 130 in some examples. In other examples, the model 200 may be imported via the model import/export module 140. In some implementations, the diagram of FIG. 2 may be presented as a screen display outputted by the display device of the interface 170.

Figure 3:
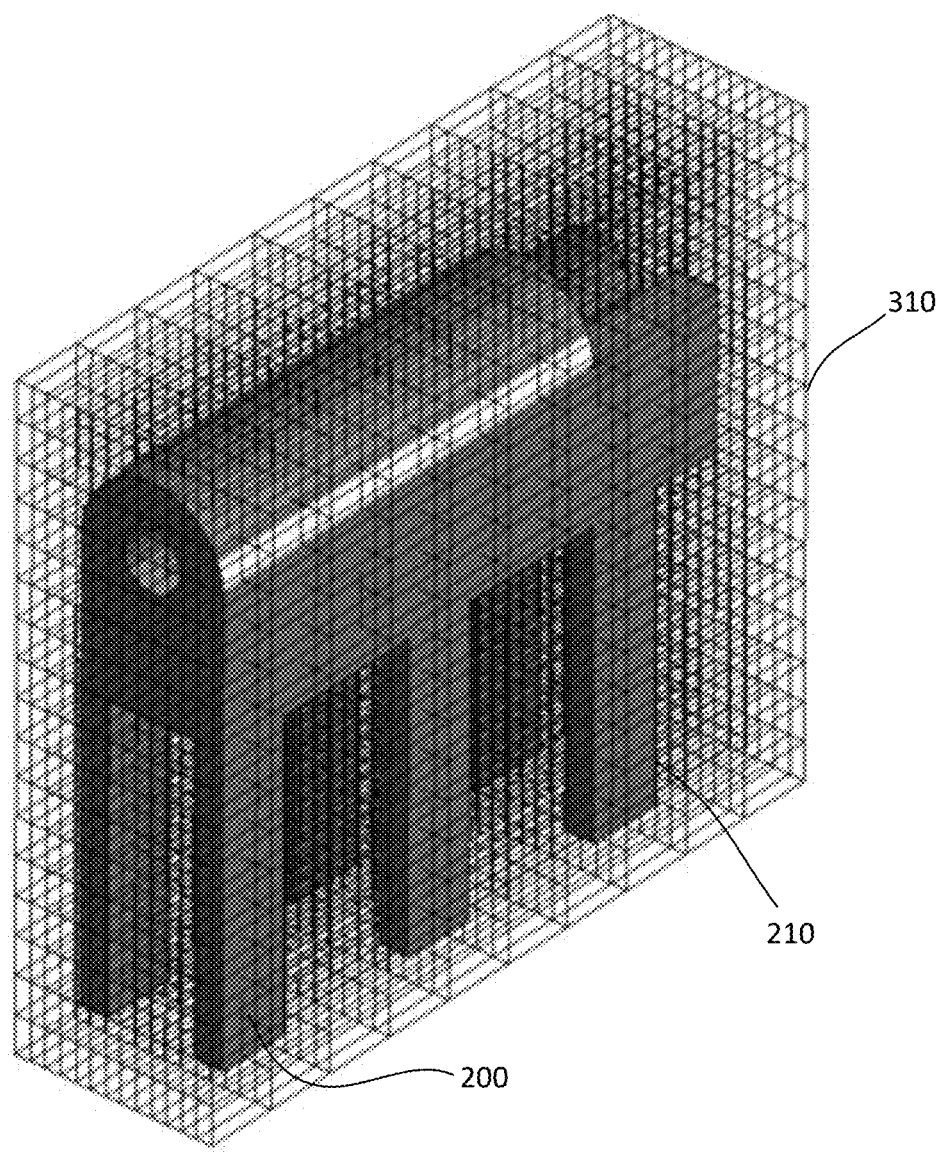
FIG. 3 is a diagram illustrating a perspective view of a mesh defined for a model according to some examples.

FIG. 3 is a diagram illustrating a perspective view of a mesh 310 defined for the model 200 (FIG. 2) according to some examples. Referring to FIGS. 1-3, in some implementations, the diagram of FIG. 3 (including the model 200 and the mesh 310) may be presented as a screen display outputted by the display device of the interface 170. In some examples, the mesh 310 may be a finite element mesh defined independently from the geometry (e.g., the surface 210) of the model 200. That is, aside from the mesh 310 as a whole being generated to cover every part of the model 200, the mesh 310 may otherwise have no correspondence with the geometry. As shown, the mesh 310 may have a combined volume that exceeds a volume of the model 200 (e.g., the volume enclosed by the surface 210) to ensure that every part of the model 200 is contained within a regular element.

The mesh 310 (e.g., a voxel mesh) may include individual elements having a regular and uniform size, shape, or volume. Such elements may be referred to as "regular elements." Each regular element of the mesh 310 may have a shape of a rectangular cuboid or another suitable shape. Thus, the mesh 310 partitions the model 200 in terms of its volume and appears grid-like.

Each individual regular element may be categorized in one of three classes. Each of a first class of regular elements refers to any regular element that fully contains a respective portion of the model. That is, a regular element of the first class is fully enclosed by the surface 210. In some instances, an edge or surface of a regular element of the first class may be shared with a corresponding portion of the surface 210, and the rest of the regular element of the first class may be enclosed by the surface 210 (within the interior volume of the model 200 as defined by (enclosed by) the surface 210). A regular element of the first class may be referred to herein as a first regular element. In addition, each of a second class of regular elements refers to any regular element that excludes any portion of the model 200. That is, a regular element of the second class is fully external to the model 200 and an enclosure of the surface 210. In some instances, an edge or surface of a regular element of the second class may be shared with a corresponding portion of the surface 210, and the rest of the element of the second class is external to the interior volume defined by the surface 210. A regular element of the second class may be referred to herein as a second regular element. Furthermore, each of a third class of regular elements refers to any regular element that partially (but not fully) contains a respective portion of the model 200. In some instances, a portion of the surface 210 is within a third-class element (e.g., within an interior volume of the third-class element). A regular element of the third class may be referred to herein as a third regular element.

Figure 4:
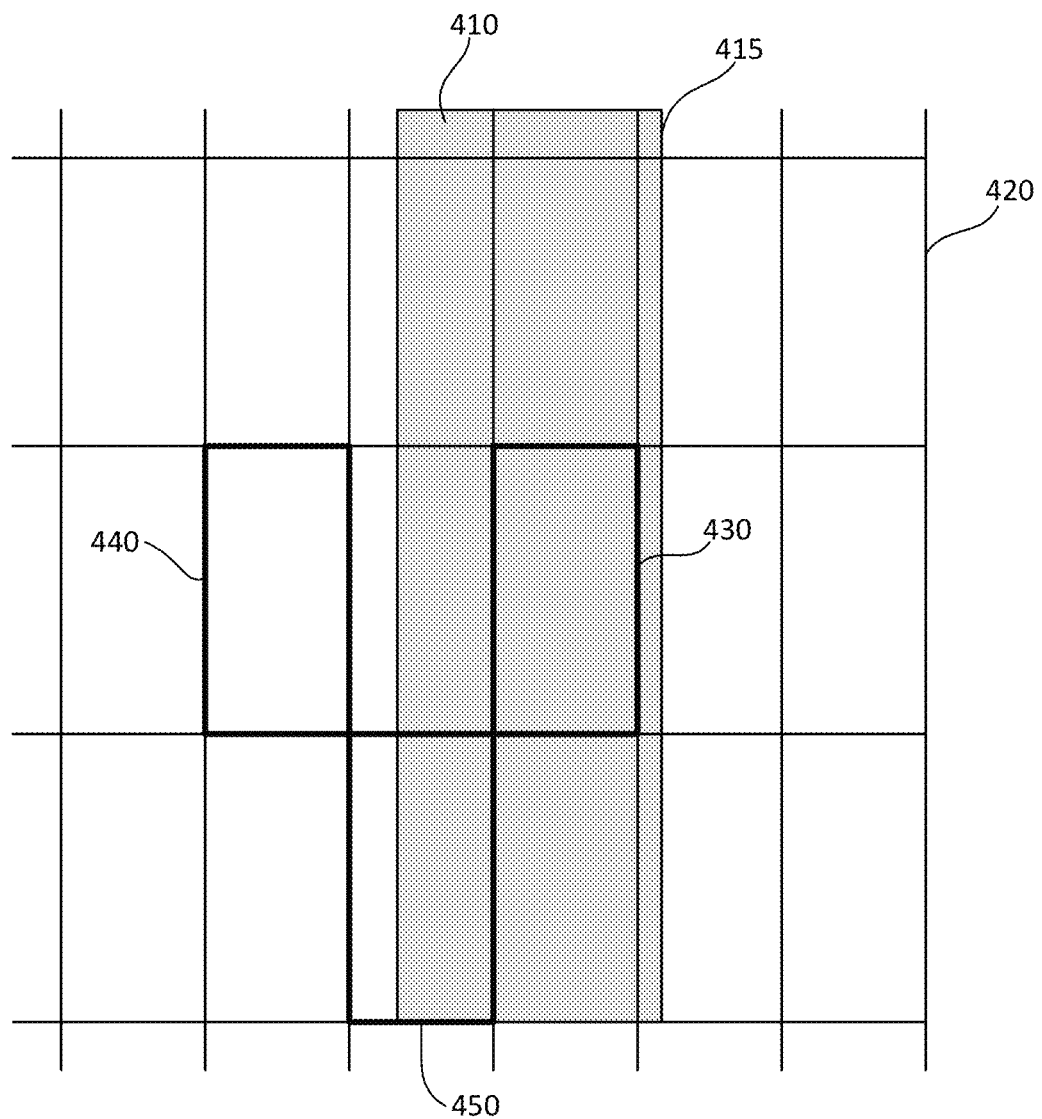
FIG. 4 is a diagram illustrating three classes of regular elements of a mesh defined for a model according to some examples.

A non-limiting example is set forth in FIG. 4 with respect to a representative mesh 420 shown in a 2-dimensional view for clarity. Referring to FIGS. 1-4, in some implementations, the diagram of FIG. 4 (including the model 410 and the mesh 420) may be presented as a screen display outputted by the display device of the interface 170. The mesh 420 may be defined for the model 410 (a cross-sectional view of which is presented in FIG. 4). A first regular element 430 may be in the first class, and the first regular element 430 fully contains a corresponding portion of the model 410. The first regular element 430 is fully contained in the model 410 (e.g., enclosed by a surface 415 of the model 410). A second regular element 440 may be in the second class, and the second regular element 440 excludes or otherwise does not contain any portion of the model 410. The second regular element 440 is fully external to the model 410 (e.g., outside of the enclosure of the surface 415). A third regular element 450 may be in the third class, and the third regular element 450 partially contains a corresponding portion of the model 410. The third regular element 450 contains a part of the surface 415 within boundaries of the third regular element 450.

A volume fraction (VF) may be determined for one or more of the regular elements defined for a given model, for example, using expression:

$$VF = \frac{V_{mi}}{V_r}; \qquad (1)$$

where $V_{mi}$ may be a volume of a corresponding portion of the model contained within boundaries of a particular regular element i, and $V_r$ may be a total volume of a regular element defined for the model (e.g., the total volume of the regular element i). For instance, for a first-class element (e.g., the first regular element 430), the VF may be 1. For a second-class element (e.g., the second regular element 440), the VF may be 0. Thus, the contribution of the second regular element 440 to any FEM or FEA may be 0. For a third-class element (e.g., the third regular element 450), the VF may be 0<VF<1. The volume fraction for each regular element may be stored in the database 160.

Figure 5:
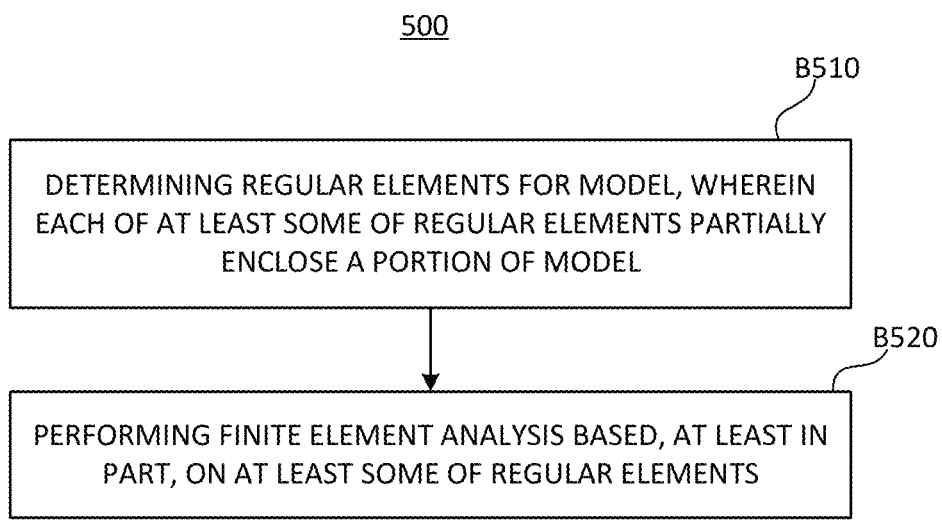
FIG. 5 is a process flow diagram illustrating a method for performing a simulation based on elements that partially enclose a portion of a model according to various examples.

FIG. 5 is a process flow-chart diagram illustrating a method 500 for modeling a physical object and performing simulation (e.g., FEM, FEA, or the like) on a model representing the physical objection according to various examples. Referring to FIGS. 1-5, the method 500 may be performed by the processing circuit 102 according to various examples.

At block B510, the mesh module 110 may determine regular elements (e.g., the regular elements 430, 440, 450) that define the model (e.g., the model 410) according to some examples. Each of at least some of the regular elements may partially contain a corresponding portion of the model. For instance, the third regular elements (e.g., the third regular element 450) may partially contain a corresponding portion of the model. The volume fraction with respect to each regular element defined may be determined, for example, by the volume fraction module 120. The mesh defined at block B510, the model for which the mesh is defined, or the like may be displayed by the display device of the interface 170. In some examples, the mesh and the model may be displayed in a same screen display, as shown in FIGS. 3 and 4.

At block B520, the simulation module 150 may perform simulations (e.g., structural finite element analysis or mechanical finite element analysis) based, at least in part, on the at least some of the regular elements (e.g., the third-class elements). Structural finite element analysis or mechanical finite element analysis refers to a simulation where the model analyzed is a solid (and not a fluid or gas). In some examples, the simulation module 150 may retrieve the volume fractions with respect to each of the regular elements defined in the mesh from the database 160. The simulation module 150 may account for the volume fractions while performing the simulation. For instance, the simulation module 150 may perform numerical integrations for each regular element based on a corresponding volume fraction in the manner described. In structural finite element or mechanical finite element simulations where the model material is a solid, the finite element mesh/grid is attached to and deforms with the solid. As described herein, a mesh composed of regular finite elements and the volume fraction technique are used in combination to accurately represent the material of the model (e.g., the model 410). In other approaches in which an Octree method be fully contained in the geometry, a finer and finer mesh is needed to obtain an accurate representation of the volume and partially filled elements would not be used, and hence volume fraction would not be employed.

Figure 6:
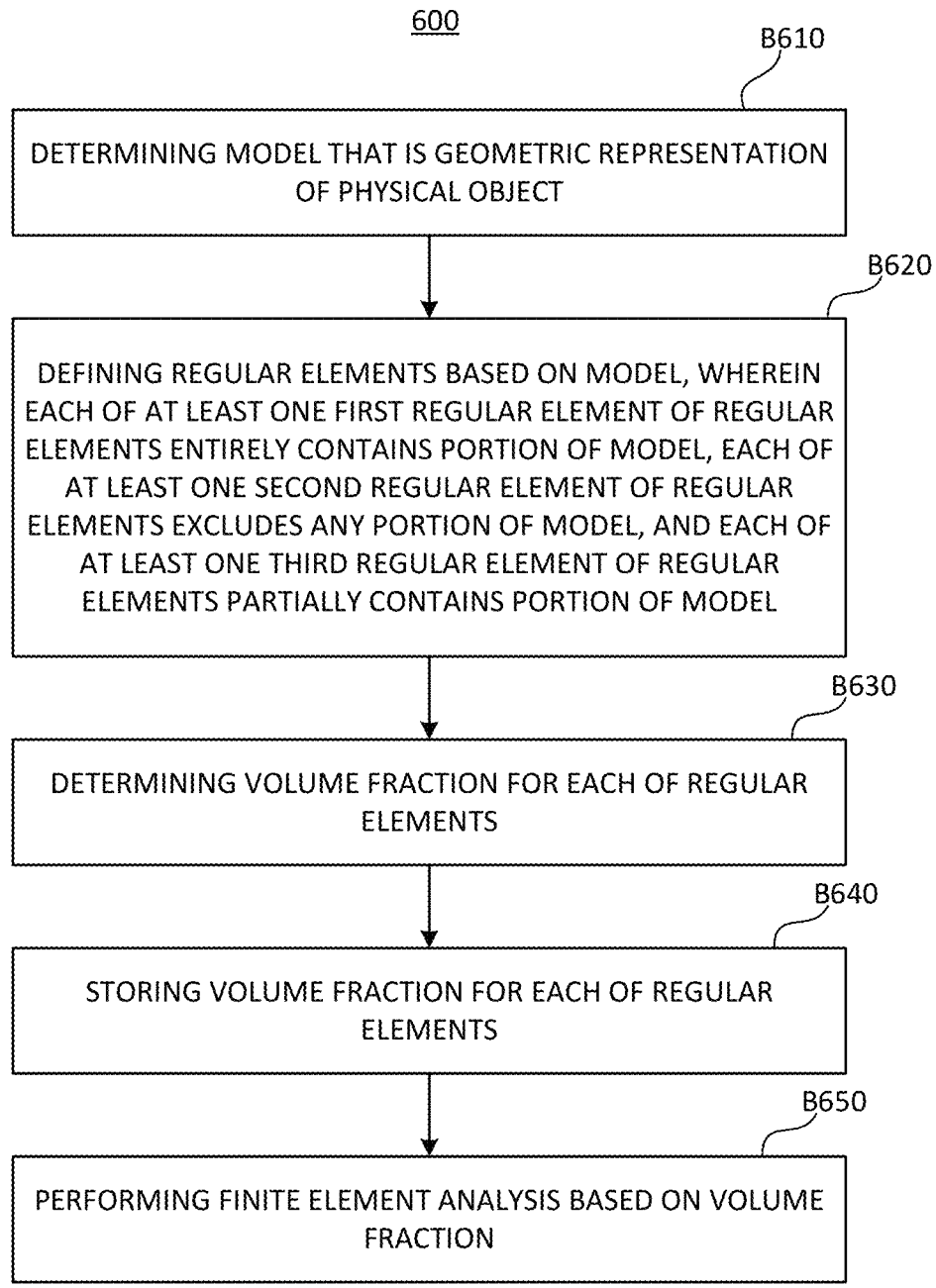
FIG. 6 is a process flow diagram illustrating a method for performing a simulation based on elements that partially enclose a portion of a model according to various examples.

FIG. 6 is a process flow-chart diagram illustrating a method 600 for modeling a physical object and performing simulation (e.g., FEM, FEA, or the like) on a model representing the physical objection according to various examples. Referring to FIGS. 1-6, the method 600 may be a particular, non-limiting implementation of the method 500. The method 600 may be performed by the processing circuit 102 according to various examples.

At block B610, the model generation module 130 and/or the model import/export module 140 may determine a model (e.g., the model 200 or 410) that is a geometric representation of a physical object. At block B620, the mesh module 110 may define regular elements (e.g., the elements 430-450) for the model. For instance, the mesh module 110 may generate a finite element mesh for the model that includes the regular elements. The regular elements defined for the model may be classified in one of the first class, second class, or third class. Each of at least one first regular element (if any) defined for the model entirely contains a portion of the model within the regular element. Each of at least one second regular element (if any) excludes any portion of the model within the regular element. Each of at least one third regular element (if any) partially contains portion of the model within the regular element.

Depending on the shape of the model, all three classes may not be represented. In some examples, the model created may be a thin lattice structure (e.g., in additive manufacturing simulation) having a thickness corresponding to dimensions of one regular element or less. For such a thin lattice structure model, a mesh defined for the model may not include any regular elements of the first class given that the thickness of the model cannot allow any regular elements to be completely (e.g., 100%) contained in the model.

At block B630, the volume fraction module 120 may determine a volume fraction for each of the one or more of the regular elements. Illustrating with a non-limiting example, the volume fraction may be determined using expression (1). At block B640, the volume fraction for the one or more of the regular elements may be stored in the database 160. At block B650, the simulation module 150 may perform simulations (e.g., structural finite element analysis or mechanical finite element analysis) based, at least in part, on the volume fraction for each of one or more of the regular elements. Structural finite element analysis or mechanical finite element analysis refers to a simulation where the model analyzed is a solid (and not a fluid or gas).

Illustrating with a non-limiting example, performing the FEM or FEA may include generating element matrices (including, but not limited to, thickness matrices, mass matrices, or other types of matrices for other types of physics) with respect to a volume or a surface area of the model. The element matrices may take a form of:

$$\int A\, dv \qquad (2);$$

alternatively, the element matrices may take a form of $$\int A\, da \qquad (3);$$

A may be one or a combination of element matrices. With respect to expression (2), an integration may be performed over a volume of a regular element for determining applied stiffness, mass, volumetric load, volumetric thermal flux, or other types of responses. With respect to expression (3), an integration may be performed over an exterior surface area of a regular element for determining stiffness, mass, surface load, surface thermal flux, or other types of responses.

In some examples, performing the finite element analysis includes evaluating the element matrices with respect to the one or more of the regular elements based on the volume fraction for the one or more of the regular elements. Illustrating with a non-limiting example, the element matrices may be evaluated using a numerical integration of FEM, such as:

$$\Sigma B_j \cdot \det_j \cdot VF_j \qquad (4).$$

where $B_j$ may be a discretized form of A of expression (2) or (3) at an integration point j, $\det_j$ may be a determinant at integration point j, and $VF_j$ may represent the volume fraction at the integration point j over a regular element associated with the integration point j. For example, the integration over a given regular element may be converted to the weighted sum over the integration points, where $\det_j$ may be an effective weight. There may be one or more integration points for a given regular element. For example, the integration over a given regular element may be converted to the weighted sum over the integration points, where $\det_j$ may be an effective weight. There are one or more integration points for a given regular element.

Figure 7A:
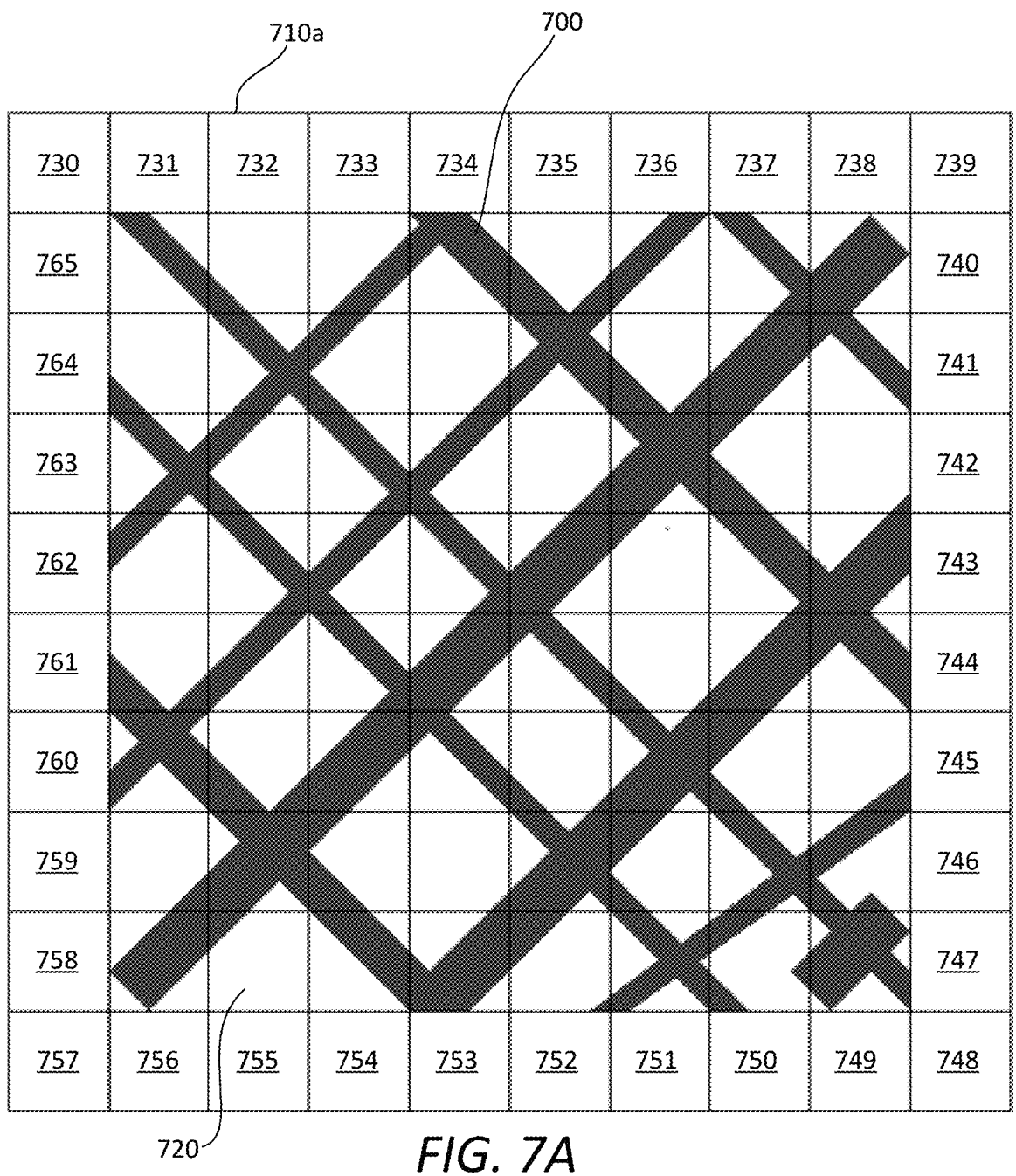
FIG. 7A is a diagram illustrating regular elements of a mesh defined for a model according to some examples.
Figure 7B:
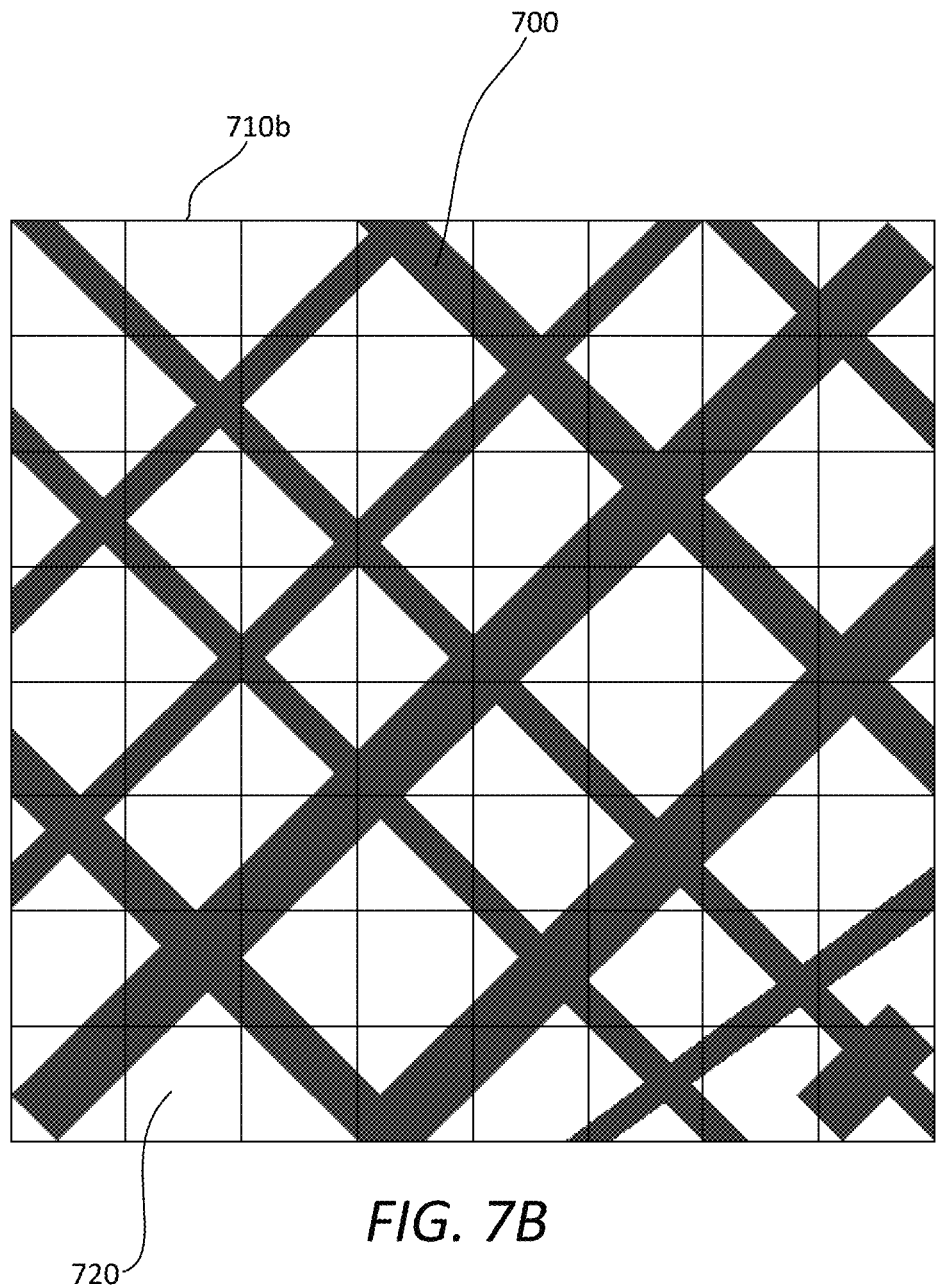
FIG. 7B is a diagram illustrating regular elements of a mesh defined for a model according to some examples.

FIG. 7A is a diagram illustrating a 2-dimensional cross-sectional view of a mesh 710a defined for a model 700 according to some examples. FIG. 7B is a diagram illustrating a 2-dimensional cross-sectional view of a mesh 710b defined for the model 700 (FIG. 7A) according to some examples. Referring to FIGS. 1-7B, the mesh 710a may include second regular elements 730-765. As shown, each of the second regular elements 730-765 may not include any portion of the model 700. The mesh 710a may include third regular elements (such as, but not limited to, a third regular element 720). The third regular elements of the mesh 710 may each include at least a part of the model 700. The mesh 710a may not include any first regular elements given the shape of the model 700.

In some examples, the simulation module 150 may be capable of removing any second regular elements (e.g., the second regular elements 730-765), as the second regular elements may not contribute to the simulation results. Further computational efficiency can be accordingly achieved. Illustrating with a non-limiting example, the mesh 710b may be the mesh 710a with empty bordering elements (e.g., the second regular elements 730-765) removed. Accordingly, each regular element in the mesh 710b defined for the model 700 may be a third regular element.

While examples described herein illustrate various selection methods using a mouse cursor, the input device of the interface 170 can provide other mechanisms to receive user selection such as, but not limited to, touch screen, voice input, and the like.

The terms "system," "logic," "module," "data processing apparatus," or "computing device" encompasses all kinds of circuits, apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question (e.g., code that constitutes processor firmware, a protocol stack, a database management system, an operating system, a cross-platform runtime environment, a virtual machine, or a combination of one or more of them). The apparatus and execution environment can realize various different computing model infrastructures, such as web services, distributed computing and grid computing infrastructures.

The construction and arrangement of the systems and methods as shown in the various exemplary examples are illustrative only. Although only a few examples have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. Other substitutions, modifications, changes, and omissions can be made in the design, operating conditions and arrangement of the exemplary examples without departing from the scope of the present disclosure.

The present disclosure contemplates methods, systems and program products on any machine-readable media for accomplishing various operations. The examples of the present disclosure can be implemented using existing computer processors, or by a special purpose computer processor for an appropriate system, incorporated for this or another purpose, networked systems or by a hardwired system. Examples within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions. The machine-executable instructions can be executed on any type of computing device (e.g., computer, laptop, etc.) or can be embedded on any type of electronic device (e.g., a portable storage device such as a flash drive, etc.).

Although the figures can show a specific order of method steps, the order of the steps can differ from what is depicted. Also, two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision step.

What is claimed is:

1. A method for performing finite element analysis of a model of a physical object, the method comprising:
   determining regular elements for the model, wherein a part but not all of each of at least some of the regular elements contains a portion of the model; and
   performing the finite element analysis based on the at least some of the regular elements, wherein the finite element analysis is a structural finite element analysis, performing the structural element analysis comprising:
   determining a volume fraction for each of the regular elements; and
   performing numerical integration for each of the regular elements using the volume fraction.

2. The method of claim 1, wherein:
   the model is a geometric representation of the physical object;
   the geometric representation is a closed-surface; and
   the closed-surface is a discretized surface or a continuous surface.

3. The method of claim 2, wherein:
   the discretized surface is represented by triangular or quadrilateral patches; and
   the continuous surface is represented by at least one of a Bezier surface, Coons surface, or Non-Uniform Rational Basis Spline (NURBS) surface.

4. The method of claim 1, wherein the regular elements are voxel mesh elements having a uniform shape.

5. The method of claim 4, wherein the uniform shape is a rectangular cuboid.

6. The method of claim 1, wherein a combined volume of all the regular elements is greater than a volume of the model.

7. The method of claim 1, wherein each of at least one first regular element of the regular elements entirely contain a respective portion of the model.

8. The method of claim 1, wherein each of at least one second regular element of the regular elements excludes any portion of the model.

9. The method of claim 1, wherein each of at least one third regular element of the regular elements is one of the at least some of the regular elements that contains the portion of the model.

10. The method of claim 1, wherein performing the finite element analysis comprises:
    storing the volume fraction for each of the regular elements.

11. The method of claim 10, wherein performing the finite element analysis comprises generating element matrices with respect to a volume or a surface area of the model.

12. The method of claim 11, wherein performing the finite element analysis further comprises evaluating the element matrices with respect to the regular elements based on the volume fraction for each of the regular elements.

13. The method of claim 1, further comprising displaying one or more of a geometric representation of the geometric representation or a mesh including the regular elements for the model.

14. The method of claim 1, wherein determining the regular elements for the model comprises generating a finite element mesh for the model, the finite element mesh comprising the regular elements, the finite element mesh being different from the model.

15. A non-transitory computer-readable medium having computer-readable instructions such that, when executed by a processor, causes the processor to:

determine regular elements for the model, wherein a part but not all of each of at least some of the regular elements contains a portion of the model; and perform the finite element analysis based on the at least some of the regular elements, wherein the finite element analysis is a structural finite element analysis, the processor performs the structural element analysis by:

determining a volume fraction for each of the regular elements; and performing numerical integration for each of the regular elements using the volume fraction.

16. The non-transitory computer-readable medium of claim 15, wherein the processor performs the finite element analysis by:

storing the volume fraction for each of the regular elements.

17. The non-transitory computer-readable medium of claim 16, wherein the processor performs the finite element analysis by generating element matrices with respect to a volume or a surface area of the model.

18. The non-transitory computer-readable medium of claim 17, wherein the processor performs the finite element analysis by further evaluating the element matrices with respect to the regular elements based on the volume fraction for each of the regular elements.

19. The non-transitory computer-readable medium of claim 15, wherein the processor is further configured to cause a user interface to display one or more of a geometric representation of the geometric representation or a mesh including the regular elements for the model.

20. An apparatus capable of performing finite element analysis of a model of a physical object, the apparatus comprises:

a memory;

a user interface; and a processor configured to:

determine regular elements for the model, wherein a part but not all of each of at least some of the regular elements contains a portion of the model; and perform the finite element analysis based on the at least some of the regular elements, wherein the finite element analysis is a structural finite element analysis, performing the structural element analysis comprising:

determining a volume fraction for each of the regular elements; and performing numerical integration for each of the regular elements using the volume fraction.

* * * * *